United States Patent [19]
Brearley et al.

[11] Patent Number: 6,149,048
[45] Date of Patent: Nov. 21, 2000

[54] APPARATUS AND METHOD FOR USE IN MANUFACTURING SEMICONDUCTOR DEVICES

[75] Inventors: William Brearley, Poughkeepsie; Laertis Economikos, Wappingers Falls; Paul F. Findeis, Glenham; Kimberley A. Kelly, Poughkeepsie; Bouwe W. Leenstra, Walden; Arthur Gilman Merryman, Hopewell Junction; Eric Daniel Perfecto, Poughkeepsie; Chandrika Prasad, Wappingers Falls; James Patrick Wood, Beacon; Roy Yu, Wappingers Falls, all of N.Y.

[73] Assignee: International Business Machines Corporation, Armonk, N.Y.

[21] Appl. No.: 09/057,421

[22] Filed: Apr. 8, 1998

Related U.S. Application Data

[62] Division of application No. 08/576,185, Dec. 21, 1995.

[51] Int. Cl.⁷ .................................................. B23K 1/00
[52] U.S. Cl. ........................... 228/33; 228/41; 228/254; 228/248.1; 29/874; 438/612; 438/613
[58] Field of Search .................................. 228/139, 212, 228/262.1, 262.45, 33, 41, 254, 248.1; 438/106, 612, 613; 269/40, 37, 903; 432/18; 29/874

[56] References Cited

U.S. PATENT DOCUMENTS

| | | | |
|---|---|---|---|
| 4,558,812 | 12/1985 | Bailey et al. | 228/180.1 |
| 4,760,948 | 8/1988 | Spiecker | 228/180.2 |
| 4,767,047 | 8/1988 | Todd et al. | 228/6.2 |
| 4,787,550 | 11/1988 | Masuda et al. | 228/47 |
| 5,025,974 | 6/1991 | Strickland | 228/107 |
| 5,174,016 | 12/1992 | Todd | 29/762 |
| 5,441,194 | 8/1995 | Nishimura et al. | 228/6.2 |
| 5,658,827 | 8/1997 | Aulicino et al. | 228/180.22 |
| 5,758,817 | 6/1998 | Chapman | 228/264 |
| 5,759,269 | 6/1998 | Cutting et al. | 118/213 |
| 5,872,051 | 2/1999 | Fallon et al. | 438/616 |
| 5,954,842 | 9/1999 | Fogal et al. | 29/25.1 |

*Primary Examiner*—Patrick Ryan
*Assistant Examiner*—Jonathan Johnson
*Attorney, Agent, or Firm*—Aziz M. Ahsan

[57] ABSTRACT

An apparatus for use in manufacturing a semiconductor device includes an input-output (IO) face having a plurality of IO lands, and is situated in an operating position in abutting relation with a depositor. The apparatus includes a first holding member holding the depositor in a first position; a second holding member holding the semiconductor device in the operating position. The depositor and the semiconductor device cooperate in the operating position to deposit solder ball connection structures to the IO lands. The apparatus further includes a separating member for moving at least one of the depositor and the semiconductor device from the operating position to an interim orientation. The interim orientation establishes a separation distance intermediate the depositor and the semiconductor device appropriate to disengage the solder ball connecting structures from the depositor.

48 Claims, 1 Drawing Sheet

APPARATUS AND METHOD FOR USE IN MANUFACTURING SEMICONDUCTOR DEVICES

CROSS-REFERENCE TO RELATED PATENT APPLICATION

This patent application is a Divisional patent application of U.S. patent application Ser. No. 08/576,185, filed on Dec. 21, 1995.

BACKGROUND OF THE INVENTION

The present invention is directed to an apparatus and method for use in manufacturing a semiconductor device including an input-output (IO) face having a plurality of IO lands. The semiconductor device is situated in an operating position with a mold for depositing solder ball connection structures to the IO lands for implementing controlled collapse chip connection (C4) IO connection structures. Such solder ball C4 connection structures are useful for such semiconductor devices as single-chip or multi-chip module packages. In particular, the apparatus of the present invention is directed to a fixture for use in selectively positioning a semiconductor device and a depositor in a manufacturing process, and for separating the semiconductor device and depositor to a separation distance while the semiconductor device and depositor are subjected to appropriate ambient conditions for effecting reflow of the solder material in the depositor. The method of the present invention includes the steps of separating the semiconductor device and the depositor to a separation distance after effecting initial reflow of solder to form interim solder balls, and effecting continued reflow (or a renewed reflow) of the interim solder balls to final solder balls free of imperfections impressed in the interim solder balls by contact with cavities in the depositor.

When using a depositor having a plurality of cavities containing solder material for wettingly applying the solder material to the IO lands of a semiconductor device, there is a need to ensure that no more than a predetermined distance separates the cavity bottom from the IO lands. A predetermined amount of solder is contained within each depositor cavity to produce the desired amount of solder on the IO land. If the distance between the cavity bottom and the IO land is too great, then the solder will not reach the IO land when the semiconductor device and the depositor are in the operating position and no solder deposition will occur. However, when there is an appropriate distance between the IO land and the solder material within the cavity (i.e., the cavity depth is appropriate for the desired amount of solder to be deposited on the IO land), then there is continued contact between the deposited solder and the depositor after solder deposition has occurred. Thus, in such situations, after reflow has formed the solder ball there is an impression of the depositor left on the solder structure. This impression precludes the solder structure's achieving a true solder ball configuration. Such untrue shape contributes to unpredictability in solder ball connection in C4 connection operations between the semiconductor device and other components.

What is needed is an apparatus and a method to ensure that solder depositions are reliably and repeatably effected when a depositor is used for depositing solder to a semiconductor device. There must be true solder ball depositions on the semiconductor device IO lands.

SUMMARY OF THE INVENTION

The invention is an apparatus for use in manufacturing a semiconductor device. The semiconductor device includes an input-output (IO) face having a plurality of IO lands, and is situated in an operating position in substantially abutting relation with a depositor. The apparatus includes a first holding member which holds the depositor in a first position; a second holding member which holds the semiconductor device in the operating position. The depositor and the semiconductor device cooperate in the operating position to deposit solder ball connection structures to the IO lands. The apparatus further includes a separating member for moving at least one of the depositor and the semiconductor device from the operating position to an interim orientation. The interim orientation establishes a separation distance intermediate the depositor and the semiconductor device appropriate to disengage the solder ball connecting structures from the depositor.

In the preferred embodiment of the invention, the separating means includes a bias means which urges the depositor and the semiconductor device apart. The bias means preferably has a thermal coefficient of expansion (TCE) appropriate to expand the bias means a predetermined distance when subjected to temperatures appropriate for solder reflow. The separating means further includes a separator actuator. The bias means is situated at a first locus intermediate the depositor and the semiconductor device; the separator actuator is situated at a second locus intermediate the depositor and the semiconductor device. The bias means and the separator actuator cooperate in response to application of appropriate heat to expand the bias means to displace the semiconductor device and the depositor. Separation of the semiconductor device and the depositor occurs with the depositor and the semiconductor device in substantially parallel planes. A preferred structure for the separator actuator is a wedge structure which is biasedly urged intermediate the semiconductor device and the depositor. Another structure for the separator actuator is a lever structure which is biasedly urged intermediate the semiconductor device and the depositor.

In its most preferred embodiment, the invention is a fixture for use in selectively positioning a semiconductor device and a depositor in a manufacturing process. The semiconductor device includes an input-output (IO) face having a plurality of IO lands. The semiconductor device and the depositor are positioned in an operating position in substantially abutting relation with the IO face adjacent the depositor and the plurality of IO lands substantially in register with a plurality of cavities in the depositor. The fixture includes a base member which holds the depositor in a first position; an urging member which urges the semiconductor device against the base member in the operating position; and a separating member which is configured for selective actuation while the semiconductor device and the depositor are in the operating position and are exposed to appropriate ambient conditions to effect reflow of solder material in the plurality of cavities. The actuation moves the semiconductor device and the depositor to an interim orientation which establishes a separation distance intermediate the depositor and the semiconductor device appropriate to disengage the solder material from the depositor.

It is, therefore, an object of the present invention to provide an apparatus for use in manufacturing a semiconductor device with a depositor for depositing solder ball connection structures to input-output (IO) lands of the semiconductor device which reliably and repeatably ensures the attainment of true solder ball configured connection structures.

It is also an object of the present invention to provide a method for reliably and repeatably attaining true solder ball configured connection structures when using a depositor for depositing solder ball connection structures to IO lands of a semiconductor device.

Further objects and features of the present invention will be apparent from the following specification and claims when considered in connection with the accompanying drawings illustrating the preferred embodiment of the invention.

DETAILED DESCRIPTION OF THE INVENTION

Figure 1:
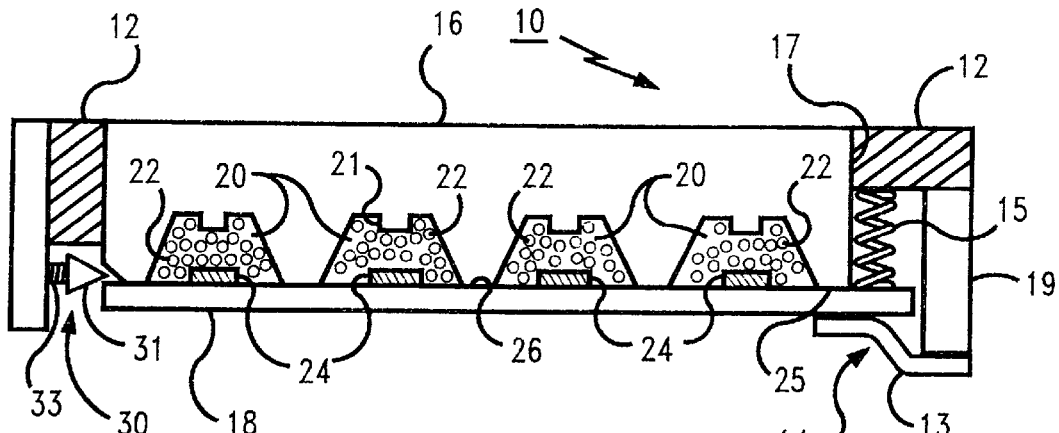
FIG. 1 is a schematic drawing of the apparatus of the present invention not subjected to temperatures appropriate for solder reflow and poised for placement in the operating position.

FIG. 1 is a schematic drawing of the apparatus of the present invention not subjected to temperatures appropriate for solder reflow and poised for placement in the operating position. In FIG. 1, an apparatus, or fixture 10 includes a first holding member 12 and a second holding member 14. First holding member 12 holds a depositor 16 in a first position; second holding member 14 holds a semiconductor device 18 in a second position.

First holding member 12 grips depositor 16, preferably about periphery 17, with a sufficient gripping force to maintain depositor 16 in its first position throughout manufacturing operations to which depositor 16 is subjected. Depositor 16, semiconductor device 18, and apparatus 10 are intended for employment in a solder reflow manufacturing operation. For that reason, the gripping force maintained by first holding member 12 on depositor 16 must remain substantially constant during thermal cycling through a substantially wide temperature range. Any holding, or biasing, structure may be used to effect such substantially constant grip upon depositor 16 without straying from the scope of the present invention.

Second holding member 14 urges semiconductor device 18 in abutting relation with depositor 16. Second holding member 14 includes a bias member 15 and a clamping member 13. Bias member 15 is illustrated representatively in FIG. 1; in order that a bias force be applied against semiconductor device 18 substantially equally across IO face 26 of semiconductor device 18, there may be a plurality of bias members 15 arrayed about IO face 26. Only one such bias member 15 is illustrated in order to simplify the drawings and to facilitate understanding the invention. Clamping member 13 is preferably configured to be advanced toward depositor 16 in order to overcome the bias force applied to IO face 26 by bias member 15, and to advance semiconductor device 18 to abutting relation with depositor 16. Such a mechanism for advancing clamping member 13 may be a threaded advancement mechanism (not shown) for advancing leg 19 of first holding member 12 into first holding member 12. Other mechanisms for clamping semiconductor device 18 into a second position poised for placement in the operating position with respect to depositor 16 may be employed without departing from the scope of the present invention. Bias member 15 is preferably a length appropriate to extend bias member 15 to a position substantially coplanar with operating face 25 of depositor 16. Bias member 15 is manufactured of a material having a thermal coefficient of expansion (TCE) to cause bias member 15 to extend beyond operating face 25 when apparatus 10 is subjected to temperatures appropriate for solder reflow.

Depositor 16 includes a plurality of cavities 20. In employing depositor 16 for manufacturing semiconductor device 18, each cavity 20 has deposited therein a predetermined quantity of solder 22.

Semiconductor device 18 has a plurality of input-output (IO) lands, or pads, 24. At least some of IO lands 24 are coupled with components in the interior of semiconductor device 18 (not shown). IO lands 24 are substantially in register with cavities 20 when depositor 16 and semiconductor device 18 are in an operating position for depositing solder 22 onto IO lands 24 during manufacture of semiconductor device 18.

FIG. 1 illustrates depositor 16 and semiconductor device 18 poised for placement in the operating position.

In order to facilitate understanding the present invention, like elements will be referred to using like reference numerals in the various drawings.

Figure 2:
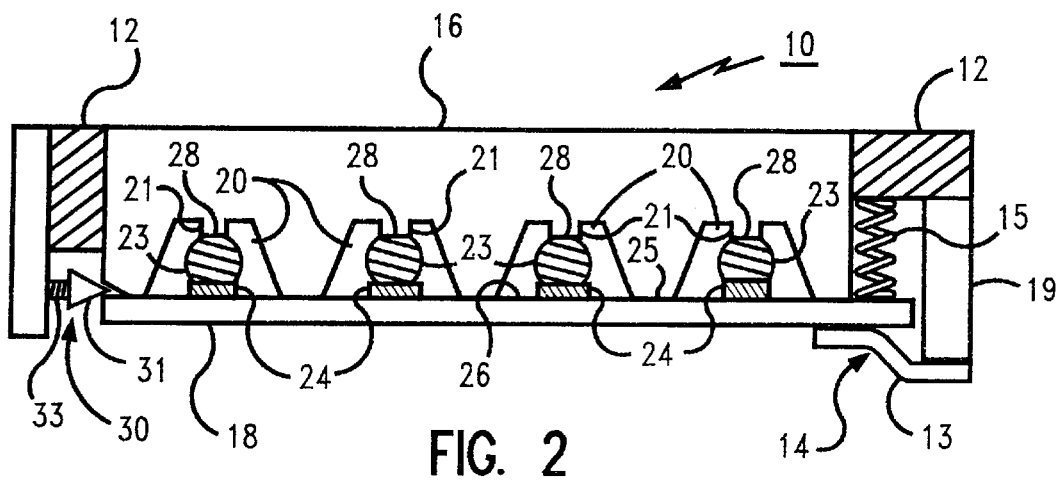
FIG. 2 is a schematic drawing of the apparatus of the present invention in the operating position.

FIG. 2 is a schematic drawing of the apparatus of the present invention in the operating position. In FIG. 2, second holding member 14 has moved semiconductor device 18 from the position illustrated in FIG. 1 to a new second position. In the new second position illustrated in FIG. 2, semiconductor device 18 is in abutting relation with depositor 16 with IO face 26 adjacent depositor 16 and abutting operating face 25. Thus, semiconductor device 18 and depositor 16 are in the operating position for manufacturing steps to deposit solder 22 to IO lands 24 in a reflow operation. IO lands 24 are substantially in register with cavities 20. During reflow, solder 22 (FIG. 1) reflows and wettingly adheres to IO lands 24 in the shape of solder balls 23. This is a known phenomenon which is advantageously employed in manufacturing controlled collapse chip connection (C4) connection structures.

Figure 3:
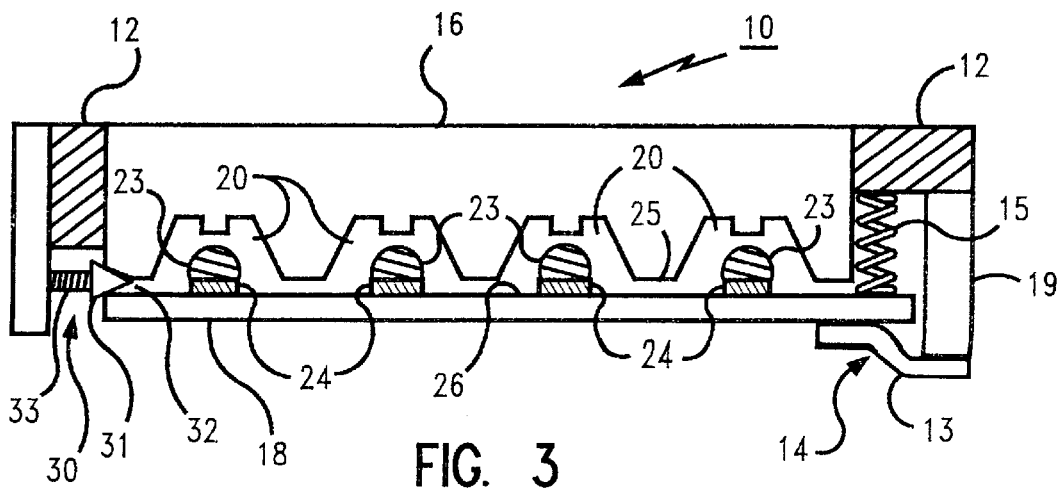
FIG. 3 is a schematic drawing of the present invention in the interim orientation.

There is a problem in manufacturing a semiconductor device 18 using a depositor 16 to achieve C4 connection structures such as solder balls 23. When reflow of solder 22 (FIG. 1) is effected to produce solder balls 23 (FIG. 2), there remains a contact spot 28 between cavity 20 and solder ball 23. In FIGS. 1–3, cavities 20 are illustrated as including a central protrusion 21. One skilled in the art of semiconductor manufacturing will recognize that, whatever the shape of cavities 20 may be, if there is to be an assured wetting contact during reflow of solder 22 (FIG. 1), there almost assuredly will be some contact between at least some solder balls 23 and some part of cavities 20 associated with those at least some solder balls 23 after reflow. The important point to recognize is that contact between solder balls 23 and cavities 20 leaves an impression, or depression on solder balls 23. Such an impression, or depression is an imperfection which interferes with reliable completion of later manufacturing steps involving solder balls 23, such as effecting connection between semiconductor device 18 and another component using solder balls 23. It is important that solder balls 23 be as close to spherical as possible for later manufacturing steps.

FIG. 3 is a schematic drawing of the present invention in the interim orientation. In FIG. 3, semiconductor device 18 has been moved, or displaced a distance from depositor 16 in order to disengage solder balls 23 from cavities 20. This disengagement movement is preferably conducted while apparatus 10, depositor 16, and semiconductor device 18 remain subjected to ambient conditions which facilitate reflow of solder material. By such removal, or disengagement of solder balls 23 and cavities 20, further reflow of solder balls 23 is enabled to eliminate the depression impressed by contact between solder balls 23 and cavities 20. Alternatively, reflow may be reinstituted after removal to the interim distance illustrated in FIG. 3.

As discussed earlier in connection with FIG. 1, apparatus 10 includes a bias member 15 and separating member, or separator actuator 30 to effect the desired separation of semiconductor device 18 and depositor 16 to relieve the impression of cavities 20 upon solder balls 23. Separating member 30 is illustrated in its preferred embodiment as a wedge structure 31 which is biasedly urged by a separation bias member 33 (such as a spring) into a wedge receiving cavity 32 intermediate IO face 26 and operating face 25. As wedge structure 31 is biasedly urged into wedge receiving cavity 32, separation between IO face 26 and operating face 25 increases and semiconductor device 18 and depositor 16 are increasingly separated. Bias member 15 moves semiconductor device 18 against resilient clamping member 13 as the TCE of bias member 15 causes bias member 15 to expand beyond operating face 25. In the preferred embodiment, the bias force applied to wedge structure 31 by separation bias member 33, the force applied to semiconductor device 18 because of the TCE of bias member 15, and the resiliency of clamping member 13 cooperate to separate depositor 16 and semiconductor device 18 in substantially parallel relation to an interim orientation as illustrated in FIG. 3. Other separation structures may be employed as well. For example, a lever with one end inserted intermediate semiconductor device 18 and depositor 16 may increasingly separate semiconductor device 18 and depositor 16 as the lever is operated using an appropriate fulcrum. Other structures may also be employed to selectively accomplish the desired separation to facilitate further reflow of solder balls 23 to eliminate the depression; such other structures may be actuated, or may engage one or the other or both of semiconductor device 18 and depositor 16 by mechanical, pneumatic, magnetic, electrical, vacuum, or other means known in the semiconductor manufacturing arts.

The method of the present invention comprises the separation of semiconductor device 18 and depositor 16 to a separation distance after effecting initial reflow of solder 22 (FIG. 1) to form interim solder balls 23 (FIG. 2), and effecting continued reflow (or a renewed reflow) of interim solder balls 23 (FIG. 2) to final solder balls 23 (FIG. 3) free of imperfections impressed in the interim solder balls by contact with cavities 20.

The depositor 16, is of a material comprised of titanium, molybdenum or graphite, and wherein the substrate 18, and the depositor 16, are heated to a temperature between 25° C. and 350° C. Furthermore, the solder 22, is an eutectic lead/tin composition of about 37 percent lead and about 63 percent tin.

Additionally, this invention relates to U.S. Pat. No. 5,658,827 (Aulicino et al.), entitled "Method for forming solder balls on a substrate", assigned to International Business Machines Corporation, and the disclosure of which is incorporated herein by reference.

It is to be understood that, while the detailed drawings and specific examples given describe preferred embodiments of the invention, they are for the purpose of illustration only, that the structure and method of the invention are not limited to the precise details and conditions disclosed, and that various changes may be made therein without departing from the spirit of the invention which is defined by the following claims.

We claim:

1. An apparatus for use in manufacturing a semiconductor device; said semiconductor device including an input-output (IO) face having a plurality of IO lands;

said semiconductor device being situated in an operating position in substantially abutting relation with a depositor; the apparatus comprising:

a first holding member; said first holding member holding said depositor in said operating position;

a second holding member; said second holding member holding said semiconductor device in said operating position; said depositor and said semiconductor device cooperating in said operating position to deposit solder ball connection structures to said IO lands; and a separating means for moving at least one of said depositor and said semiconductor device from said operating position to an interim orientation; said interim orientation establishing a separation distance intermediate said depositor and said semiconductor device appropriate to disengage said solder ball connecting structures from said depositor, and wherein said separating means includes a separator actuator.

2. An apparatus for use in manufacturing a semiconductor device as recited in claim 1 wherein said separating means includes a bias means; said bias means urging said depositor and said semiconductor device apart.

3. An apparatus for use in manufacturing a semiconductor device as recited in claim 2 wherein said separating means further includes a separator actuator; said bias means being situated at a first locus intermediate said depositor and said semiconductor device; said separator actuator being situated at a second locus intermediate said depositor and said semiconductor device; said bias means and said separator actuator cooperating in response to actuation of at least one of said bias means and said separator actuator to displace said semiconductor device and said depositor in substantially parallel planes.

4. An apparatus for use in manufacturing a semiconductor device as recited in claim 3 wherein said separator actuator includes a wedge structure; said wedge structure being urgable intermediate said semiconductor device and said depositor.

5. An apparatus for use in manufacturing a semiconductor device as recited in claim 3 wherein said separator actuator is a lever structure; said lever structure being selectively operable intermediate said semiconductor device and said depositor.

6. A fixture for use in selectively positioning a semiconductor device and a depositor in a manufacturing process; said semiconductor device including an input-output (IO) face having a plurality of IO lands; said semiconductor device and said depositor being positioned in an operating position in substantially abutting relation with said IO face adjacent said depositor and said plurality of IO lands substantially in register with a plurality of cavities in said depositor; the fixture comprising:

a base member; said base member holding said depositor in said operating position; an urging member; said urging member urging said semiconductor device against said base member in said operating position; and a separating member; said separating member being configured for actuation while said semiconductor device and said depositor are in said operating position and are exposed to appropriate ambient conditions to effect reflow of solder material in said plurality of cavities; said actuation moving said semiconductor device and said depositor to an interim orientation; said interim orientation establishing a separation distance intermediate said depositor and said semiconductor device appropriate to disengage said solder material from said depositor.

7. A fixture for use in selectively positioning a semiconductor device and a depositor in a manufacturing process as recited in claim 6 wherein said separating member includes a bias means; said bias means urging said depositor and said semiconductor device apart.

8. A fixture for use in selectively positioning a semiconductor device and a depositor in a manufacturing process as recited in claim 7 wherein said separating member further includes a separator actuator; said bias means being situated at a first locus intermediate said depositor and said semiconductor device; said separator actuator being situated at a second locus intermediate said depositor and said semiconductor device; said bias means and said separator actuator cooperating in response to actuation of at least one of said bias means and said separator actuator to displace said semiconductor device and said depositor in substantially parallel planes.

9. A fixture for use in selectively positioning a semiconductor device and a depositor in a manufacturing process as recited in claim 8 wherein said separator actuator includes a wedge structure; said wedge structure being urgable intermediate said semiconductor device and said depositor.

10. A fixture for use in selectively positioning a semiconductor device and a depositor in a manufacturing process as recited in claim 8 wherein said separator actuator is a lever structure; said lever structure being selectively operable intermediate said semiconductor device and said depositor.

11. The apparatus of claim 1, wherein said depositor is separated from said semiconductor device by a bias means urging said depositor and said semiconductor device apart.

12. The apparatus of claim 1, wherein said depositor is separated from said semiconductor device by a bias means urging said depositor and said semiconductor device apart, and wherein said bias means is selected from a group consisting of spring and a wedge structure.

13. The apparatus of claim 1, wherein said depositor is separated from said semiconductor device by a bias means urging said depositor and said semiconductor device apart, and wherein said bias means is selected from a group consisting of mechanical means, pneumatic means, magnetic means, electrical means and vacuum means.

14. The apparatus of claim 1, wherein said depositor is of a material comprised of titanium, molybdenum or graphite.

15. The apparatus of claim 1, wherein said semiconductor device and said depositor are heated to a temperature between 25 and 350 degrees Celsius.

16. The apparatus of claim 1, wherein said solder ball is an eutectic lead/tin composition.

17. The apparatus of claim 1, wherein said solder ball is an eutectic composition of about 37 percent lead and about 63 percent tin.

18. The fixture of claim 6, wherein said depositor is separated from said semiconductor device by a bias means urging said depositor and said semiconductor device apart.

19. The fixture of claim 6, wherein said depositor is separated from said semiconductor device by a bias means urging said depositor and said semiconductor device apart, and wherein said bias means is selected from a group consisting of spring and a wedge structure.

20. The fixture of claim 6, wherein said depositor is separated from said semiconductor device by a bias means urging said depositor and said semiconductor device apart, and wherein said bias means is selected from a group consisting of mechanical means, pneumatic means, magnetic means, electrical means and vacuum means.

21. The fixture of claim 6, wherein said depositor is of a material comprised of titanium, molybdenum or graphite.

22. The fixture of claim 6, wherein said semiconductor device and said depositor are heated to a temperature between 25 and 350 degrees Celsius.

23. The fixture of claim 6, wherein said solder material is an eutectic lead/tin composition.

24. The fixture of claim 6, wherein said solder material is an eutectic composition of about 37 percent lead and about 63 percent tin.

25. An apparatus for use in manufacturing a semiconductor device; said semiconductor device including an input-output (IO) face having a plurality of IO lands; said semiconductor device being situated in an operating position in substantially abutting relation with a depositor; the apparatus comprising:
a first holding member; said first holding member holding said depositor in said operating position;
a second holding member; said second holding member holding said semiconductor device in said operating position; said depositor and said semiconductor device cooperating in said operating position to deposit solder ball connection structures to said IO lands; and a separating means for moving at least one of said depositor and said semiconductor device from said operating position to an interim orientation; said interim orientation establishing a separation distance intermediate said depositor and said semiconductor device appropriate to disengage said solder ball connecting structures from said depositor, and wherein said apparatus includes a bias member manufactured of a material having a thermal coefficient of expansion to cause said bias member to extend beyond said face when said apparatus is subjected to temperatures appropriate for solder reflow.

26. The apparatus for use in manufacturing a semiconductor device as recited in claim 25, wherein said separating means includes said bias means; said bias means urging said depositor and said semiconductor device apart.

27. The apparatus for use in manufacturing a semiconductor device as recited in claim 26, wherein said separating means further includes a separator actuator; said bias means being situated at a first locus intermediate said depositor and said semiconductor device; said separator actuator being situated at a second locus intermediate said depositor and said semiconductor device; said bias means and said separator actuator cooperating in response to actuation of at least one of said bias means and said separator actuator to displace said semiconductor device and said depositor in substantially parallel planes.

28. The apparatus for use in manufacturing a semiconductor device as recited in claim 27, wherein said separator actuator includes a wedge structure; said wedge structure being urgable intermediate said semiconductor device and said depositor.

29. The apparatus for use in manufacturing a semiconductor device as recited in claim 27, wherein said separator actuator is a lever structure; said lever structure being selectively operable intermediate said semiconductor device and said depositor.

30. The apparatus of claim 25, wherein said depositor is separated from said semiconductor device by said bias means urging said depositor and said semiconductor device apart.

31. The apparatus of claim 25, wherein said depositor is separated from said semiconductor device by said bias means urging said depositor and said semiconductor device apart, and wherein said bias means is selected from a group consisting of spring and a wedge structure.

32. The apparatus of claim 25, wherein said depositor is separated from said semiconductor device by said bias means urging said depositor and said semiconductor device apart, and wherein said bias means is selected from a group consisting of mechanical means, pneumatic means, magnetic means, electrical means and vacuum means.

33. The apparatus of claim 25, wherein said depositor is of a material comprised of titanium, molybdenum or graphite.

34. The apparatus of claim 25, wherein said semiconductor device and said depositor are heated to a temperature between 25 and 350 degrees Celsius.

35. The apparatus of claim 25, wherein said solder ball is an eutectic lead/tin composition.

36. The apparatus of claim 25, wherein said solder ball is an eutectic composition of about 37 percent lead and about 63 percent tin.

37. A fixture for use in selectively positioning a semiconductor device and a depositor in a manufacturing process; said semiconductor device including an input-output (IO) face having a plurality of IO lands; said semiconductor device and said depositor being positioned in an operating position in substantially abutting relation with said IO face adjacent said depositor and said plurality of IO lands substantially in register with a plurality of cavities in said depositor; the fixture comprising:

a base member; said base member holding said depositor in said operating position; an urging member; said urging member urging said semiconductor device against said base member in said operating position; and a separating member; said separating member being configured for actuation while said semiconductor device and said depositor are in said operating position and are exposed to appropriate ambient conditions to effect reflow of solder material in said plurality of cavities; said actuation moving said semiconductor device and said depositor to an interim orientation; said interim orientation establishing a separation distance intermediate said depositor and said semiconductor device appropriate to disengage said solder material from said depositor, and wherein said fixture includes a bias member manufactured of a material having a thermal coefficient of expansion to cause said bias member to extend beyond said face when said fixture is subjected to temperatures appropriate for solder reflow.

38. The fixture for use in selectively positioning a semiconductor device and a depositor in a manufacturing process as recited in claim 37, wherein said separating member includes said bias means; said bias means urging said depositor and said semiconductor device apart.

39. The fixture for use in selectively positioning a semiconductor device and a depositor in a manufacturing process as recited in claim 38, wherein said separating member further includes a separator actuator; said bias means being situated at a first locus intermediate said depositor and said semiconductor device; said separator actuator being situated at a second locus intermediate said depositor and said semiconductor device; said bias means and said separator actuator cooperating in response to actuation of at least one of said bias means and said separator actuator to displace said semiconductor device and said depositor in substantially parallel planes.

40. The fixture for use in selectively positioning a semiconductor device and a depositor in a manufacturing process as recited in claim 39, wherein said separator actuator includes a wedge structure; said wedge structure being urgable intermediate said semiconductor device and said depositor.

41. The fixture for use in selectively positioning a semiconductor device and a depositor in a manufacturing process as recited in claim 39, wherein said separator actuator is a lever structure; said lever structure being selectively operable intermediate said semiconductor device and said depositor.

42. The fixture of claim 37, wherein said depositor is separated from said semiconductor device by said bias means urging said depositor and said semiconductor device apart.

43. The fixture of claim 37, wherein said depositor is separated from said semiconductor device by said bias means urging said depositor and said semiconductor device apart, and wherein said bias means is selected from a group consisting of spring and a wedge structure.

44. The fixture of claim 37, wherein said depositor is separated from said semiconductor device by said bias means urging said depositor and said semiconductor device apart, and wherein said bias means is selected from a group consisting of mechanical means, pneumatic means, magnetic means, electrical means and vacuum means.

45. The fixture of claim 37, wherein said depositor is of a material comprised of titanium, molybdenum or graphite.

46. The fixture of claim 37, wherein said semiconductor device and said depositor are heated to a temperature between 25 and 350 degrees Celsius.

47. The fixture of claim 37, wherein said solder material is an eutectic lead/tin composition.

48. The fixture of claim 37, wherein said solder material is an eutectic composition of about 37 percent lead and about 63 percent tin.

\* \* \* \* \*